United States Patent [19]

Inuishi et al.

[11] Patent Number: 5,258,319
[45] Date of Patent: Nov. 2, 1993

[54] METHOD OF MANUFACTURING A MOS TYPE FIELD EFFECT TRANSISTOR USING AN OBLIQUE ION IMPLANTATION STEP

[75] Inventors: Masahide Inuishi; Katsuhiro Tsukamoto, both of Hyogo, Japan

[73] Assignee: Mitsubishi Denki Kabushiki Kaisha, Tokyo, Japan

[21] Appl. No.: 747,589

[22] Filed: Aug. 20, 1991

Related U.S. Application Data

[60] Division of Ser. No. 658,430, Feb. 20, 1991, Pat. No. 5,061,975, which is a continuation of Ser. No. 310,114, Feb. 14, 1989, abandoned.

[30] Foreign Application Priority Data

Feb. 19, 1988 [JP] Japan ................... 63-38059
Feb. 19, 1988 [JP] Japan ................... 63-38060

[51] Int. Cl.$^5$ ........................... H01L 21/336
[52] U.S. Cl. ........................... 437/35; 437/44; 257/344
[58] Field of Search ............ 437/35, 40, 41, 44; 357/23.3; 257/336, 344

[56] References Cited

U.S. PATENT DOCUMENTS

| | | | |
|---|---|---|---|
| 4,258,465 | 3/1981 | Yasui et al. | 437/44 |
| 4,288,806 | 9/1981 | Ronen . | |
| 4,291,321 | 9/1981 | Pfleiderer et al. . | |
| 4,597,824 | 7/1986 | Shinada et al. . | |
| 4,712,124 | 12/1987 | Stupp . | |
| 4,771,012 | 9/1988 | Yabu et al. | 437/35 |
| 5,073,514 | 12/1991 | Ito et al. | 437/35 |
| 5,147,811 | 9/1992 | Sakagami | 437/35 |
| 5,155,369 | 10/1992 | Current | 437/35 |
| 5,158,903 | 10/1992 | Hori et al. | 437/35 |

FOREIGN PATENT DOCUMENTS

| | | | |
|---|---|---|---|
| 0144175 | 8/1984 | Japan | 437/35 |
| 0113474 | 5/1987 | Japan | 437/44 |
| 0155565 | 7/1987 | Japan | 437/44 |
| 0021919 | 1/1989 | Japan | 437/44 |
| 0187923 | 7/1989 | Japan | 437/35 |
| 0035740 | 2/1990 | Japan | 437/44 |
| 0065255 | 3/1990 | Japan | 437/35 |
| 0153538 | 6/1990 | Japan | 437/44 |
| 0161732 | 6/1990 | Japan | 437/44 |
| 2-292833 | 12/1990 | Japan | 437/35 |
| 3-142841 | 6/1991 | Japan | 437/35 |
| 3-163833 | 7/1991 | Japan | 437/35 |
| 3-194936 | 8/1991 | Japan | 437/35 |
| 3-198349 | 8/1991 | Japan | 437/35 |
| 3-203243 | 9/1991 | Japan | 437/35 |
| 3-284854 | 12/1991 | Japan | 437/35 |
| 4-23329 | 1/1992 | Japan | 437/35 |
| 4-127439 | 4/1992 | Japan | 437/35 |

OTHER PUBLICATIONS

Hori, "$\frac{1}{4}$-$\mu$m LATID (LArge-TIlt-angle-Implanted Drain) Technology for 3.3 V Operation", IEDM, 1989, pp. 777-780.

P. J. Tsang et al., "Fabrication of High-Performance LDDFET's With Oxide Sidewall-Spacer Technology", IEEE Trans. Electron Devices, ED-29, 590, 1982.

T. Y. Huang et al., "A Novel Submicron LDD Transistor With Inverse-T Gate Structure", Technical Digest of International Electron Devices Meeting, 1986, p. 742.

R. Izawa et al., "The Impact of Gate-Drain Overlapped LDD (Gold) For Deep Submicron VLSI's", Technical Digest of International Electron Devices Meeting, 1987, p. 38.

*Primary Examiner*—Mary Wilczewski
*Attorney, Agent, or Firm*—Lowe, Price, LeBlanc & Becker

[57] ABSTRACT

An MOSFET (Metal-Oxide Semiconductor Field Effect Transistor) of the present invention comprises two source-drain impurity regions formed spaced apart from each other in a semiconductor substrate. At least a drain side of the two impurity regions has a so called LDD structure in which a region of higher concentration and a region of lower concentration are off set. A gate electrode having a rectangular cross section is formed on the semiconductor substrate between the source and drain with an insulating film interposed therebetween. The gate electrode fully covers the lower concentration region of the LDD structure directly therebelow. The position of the side surface of the gate electrode is approximately aligned with the end surface of the region of higher concentration. The impurity region of lower concentration of the LDD is formed by oblique ion implantation.

9 Claims, 12 Drawing Sheets

L/W = 0.5/10μm
tox = 10nm $t_{ox} = 100 Å$ $V_D = 5V$ $V_G = 2V$

METHOD OF MANUFACTURING A MOS TYPE FIELD EFFECT TRANSISTOR USING AN OBLIQUE ION IMPLANTATION STEP

This application is a division of application Ser. No. b 07/658,430 filed Feb. 20, 1991, now U.S. Pat. No. 5,061,975 which is a continuation of application Ser. No. 07/310,114, filed Feb. 14, 1989, now abandoned.

BACKGROUND OF THE INVENTION

Field of the Invention

The present invention relates to an improvement of performance and reliability of a MOS type field effect transistor.

Description of the Background Art

Conventionally, the degree of integration of semiconductor devices have been improved by miniaturizing the structure of the devices by virtue of the development of fine processing technique. In a MOS type field effect transistor (Metal-Oxide-Semiconductor Field Effect Transistor; hereinafter referred to as a MOSFET), a gate length is shortened from the order of microns to the order of submicrons as the device structure has been miniaturized. As the gate length become shorter, the channel length also becomes shorter, causing a so called short channel effect. More specifically, as the channel length becomes shorter, the electric field concentrates near the drain, and therefore the generation of hot carriers has become a serious problem. The hot carriers enter the gate oxide film, causing changes of the threshold voltage on time basis degrading mutual conductance, thereby damaging the reliability of the MOSFET. A LDD (Lightly Doped Drain) structure is one example of a MOSFET structure proposed to solve the problem derived from the generation of hot carriers FIG. 1 shows a cross sectional structure of an n channel LDD MOSFET, disclosed in "Fabrication of High-Performance LDDFET's with Oxide Sidewall-Spacer Technology"; P. J. TSANG et al, IEEE Trans. Electron Devices., ED-29., 590, 1982. Referring to FIG. 1, a gate oxide film 2 is formed on a surface of a p type silicon substrate 1. A gate electrode 3 formed of polysilicon is formed on a surface of the gate oxide film 2. Sidewall spacers 4 of insulating films are formed on both sides of the gate electrode 3. The surface of the silicon substrate 1 covered with the gate electrode 3 will be a channel region 5. Each of two n type impurity regions 6 and 7 formed on the surface of the silicon substrate 1 comprises two layer structure having different concentrations. The n+ type impurity regions 6a and 7a having higher impurity concentration respectively have n− type impurity regions 6b and 7b having lower impurity concentration on the side of the channel region 5. The n− type impurity regions 6b and 7b having lower concentration are formed directly below and covered with the sidewall spacers 4.

The principle of the LDD structure shown in FIG. 1 will be described with reference to FIG. 2. A source 7 and a substrate 1 of a MOSFET are grounded to a potential of 0V, for example, and a drain 6 is connected to a supply voltage (5V, for example). Consequently, a reverse bias is applied to a p/n junction between the n type drain portions 6a and 6b and the p type semiconductor substrate 1 to generate a high electric field. The electric field at the drain is released more and more as a width of a depletion layer is made wider and wider. Generally, the width of the depletion layer of the p/n junction is represented by the following equation $$w = \sqrt{\frac{2\epsilon s}{q} \cdot \frac{(N_A + N_D)}{N_A \cdot N_D}} \quad (1)$$

where $N_A$ represents an acceptor concentration, $N_D$ represents a doner concentration, $\epsilon s$ represents a permittivity of the semiconductor, q represents an amount of charge, and w represents the width of the depletion layer. When the n type impurity concentration is very much higher than the impurity concentration of the p type semiconductor, that is, $N_D \gg N_A$, the width of the depletion layer will be $$w = \sqrt{\frac{2\epsilon s}{qN_A}}$$

When the n type impurity concentration is low and equal to the concentration of the p type semiconductor substrate, that is, $N_A = N_D$, the width of the depletion layer will be $$w = \sqrt{\frac{4\epsilon s}{qNA}}$$

Therefore, the electric field concentration is much more released at the p/n junction of the n−/p− substrate having lower concentration. Accordingly, the LDD MOSFET provides n− type impurity regions 6b and 7b having lower concentration at the p/n junction between the substrate 1 and the n+ type impurity regions 6a and 7a having higher concentration in order to release the electric field. Further, the generation of hot carriers is suppressed by releasing the electric field However, the LDD MOSFET newly provides two problems.

The first problem is decrease of on-resistance of the MOSFET, caused by the newly provided n− type impurity region having lower concentration serving as a parasitic resistance. This will be described with reference to FIGS. 2 and 3.

The operation of the MOSFET can be divided into two, namely, the operation in a pentode region (FIG. 2) in which the drain voltage $V_D$ is larger than the gate voltage $V_G$ ($V_D > V_G$) and an operation in a triode region (FIG. 3) in which the gate voltage $V_G$ is much larger than the drain voltage ($V_G \gg V_D$). In the pentode region shown in FIG. 2, a depletion region having high resistance is formed between an inverted layer 8 and drains 6a and 6b formed of n−/n+. In addition to the channel resistance of the inverted layer 8, the resistance of the n− type impurity region 7b having the lower concentration at the source side, the resistance of the drain side depletion layer 9 and the resistance of the n− type impurity region 6b on the side of the drain serving as parasitic resistances cause the decrease of the drain current. In the triode region, the resistance of the n− type impurity region 7b on the source side and the resistance of the drain side n− type impurity region 6b as parasitic resistances lower the on-resistance of the MOSFET as shown in FIG. 3.

The second problem relates to the hot carriers. In the drain structure of a conventional LDD MOSFET, hot carriers having larger energy than in the thermal equilibrium state are generated on the surface of the n⁻ type impurity region 6b having lower concentration, and the generated hot carriers are implanted into the sidewall spacers 4 of the gate electrode 3. Consequently, the surface of the n⁻ type impurity region 6b on the drain side is depleted, raising the resistance of the region, thereby degrading the drain characteristics of the MOSFET.

In order to solve these problems, the LDD structure has been improved. In the improvement, the n⁻ type impurity region having lower concentration is arranged directly below the gate electrode, which is called a gate overlapped LDD structure. This is disclosed in "A NOVEL SUBMICRON LDD TRANSISTOR WITH INVERSE-T GATE STRUCTURE"; T. Y. HUANG et al. Technical Digest of International Electron Devices Meeting, 1986 p. 742, and "THE IMPACT OF GATE-DRAIN OVERLAPPED LDD (GOLD) FOR DEEP SUBMICRON VLSI'S"; R. IZAWA et al., Technical Digest of International Electron Devices Meeting, 1987, p. 38. In the following, a MOSFET having the gate overlapped LDD structure will be described with reference to the first mentioned article. FIGS. 4A to 4F show steps of manufacturing the gate overlapped LDD.

First, a gate oxide film 11, a polysilicon layer 12 and a silicon oxide film 13 are formed in this order on a silicon substrate 10. A resist 14 is applied and patterned into a prescribed pattern (FIG. 4A).

Thereafter, the silicon oxide film 13 is etched using the resist 14 as a mask, and the polysilicon layer 12 is removed to some extent by etching. The thickness of the remaining polysilicon layer 12b is 50 to 100 nm (FIG. 4B). Thereafter, phosphorus ions are implanted to a low concentration in the surface of the silicon substrate using the patterned silicon oxide film 13 and the polysilicon layer 12 therebelow as masks, to form an n⁻ type impurity region 15 (FIG. 4C).

Thereafter, a silicon oxide film is deposited on the surfaces of the first silicon layer 12 and the like. This is anisotropically etched to form a sidewall spacer 17 (FIG. 4D).

Thereafter, the polysilicon layer 12b is etched using the sidewall spacer 17 as a mask to form a gate electrode 18 having an inverted T shape (FIG. 4E).

Finally, arsenic (As) is ion implanted using the sidewall spacer 17 and the like as masks to form an n⁺ type impurity region 19. Thermal oxidation is carried to activate the impurity ions (FIG. 4F).

Through the above described steps, a MOSFET having a gate overlapped LDD structure is manufactured in which the gate electrode 18 has an inverted T shape and the n⁻ type impurity region 15 is fully covered with the gate electrode 18. The gate overlapped LDD structure can prevent depletion of the surface of the n⁻ type impurity region, since the n⁻ type impurity region is under the electric field from the gate electrode. The function and effect of this structure will be described later.

However, in the conventional gate overlapped LDD structure, the gate electrode has a cross section with uneven gate length such as the inverted T shape, due to the limitation in manufacturing. Therefore, compared with a conventional gate electrode having a rectangular cross section, the effective conductive area is reduced, increasing the wiring resistance of the gate electrode.

As for the manufacturing method, the gate electrode of the inverted T shape is formed by stopping the etching at the intermediate portion of the polysilicon layer. However, the control of the etching amount of the polysilicon layer is difficult, whereby the amount of etching becomes uneven on the wafer, decreasing the production yield.

In a gate overlapped LDD MOSFET shown in the latter mentioned article, the gate electrode also has a cross section with an uneven gate length, and the manufacturing method thereof requires complicated process steps including patterning of a layer serving as a mask for ion implantation.

SUMMARY OF THE INVENTION

Therefore, one object of the present invention is to improve on-resistance of a gate overlapped type LDD MOSFET.

Another object of the present invention is to reduce parasitic resistance of a gate overlapped type LDD MOSFET.

A further object of the present invention is to improve the control of distribution of impurity regions in the LDD structure.

A still further object of the present invention is to simplify the manufacturing process for forming impurity regions in the LDD structure.

A MOS type field effect transistor of the present invention comprises a gate electrode having a uniform cross section on a semiconductor substrate, and two impurity regions having higher impurity concentration and continuous impurity regions having lower impurity concentration are formed in the semiconductor substrate sandwiching the gate electrode. The impurity regions having the lower impurity concentration are formed directly below and fully covered with the gate electrode. Consequently, surfaces of the impurity regions having lower concentration are prevented from being depleted and the generation of high parasitic resistance in the surface regions can be prevented, by virtue of the effect of the voltage applied to the gate electrode. Thus, the decrease of the drain current derived from the high resistance can be prevented and the on-resistance of the MOSFET can be improved.

The cross section of the gate electrode ensures effective conductive area compared with the conventional shape, preventing the increase of the wiring resistance.

According to another example of the present invention, two steps of oblique ion implantation are employed to form impurity regions having lower concentration in the semiconductor substrate directly below the gate electrode and to form the impurity regions having higher concentration continuous thereto. The off set between the impurity regions having lower and higher concentrations is regulated utilizing sidewall spacers formed on the side surfaces of the gate electrode. The step of oblique ion implantation saves the trouble of fabricating new masks for ion implantation, thereby simplifying the manufacturing method.

In addition, the semiconductor substrate is rotated during oblique ion implantation, whereby the the impurity regions distributed in symmetry about the first conductive layer can be easily formed.

According to a further embodiment of the present invention, these regions which need not be subjected to ion implantation are covered by a resist during the ion implantation for forming the impurity regions having lower concentration. Therefore, a MOSFET having the LDD structure only in the semiconductor substrate on one side of the gate electrode can be easily manufactured.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
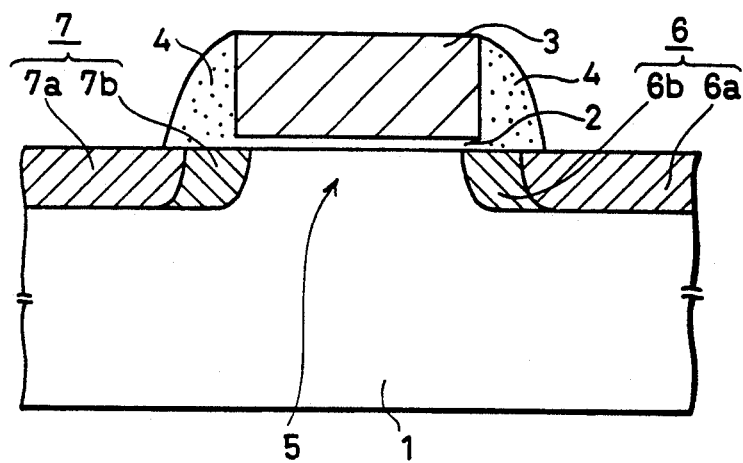
FIG. 1 is a cross sectional view of a conventional MOSFET having LDD structure.
Figure 2:
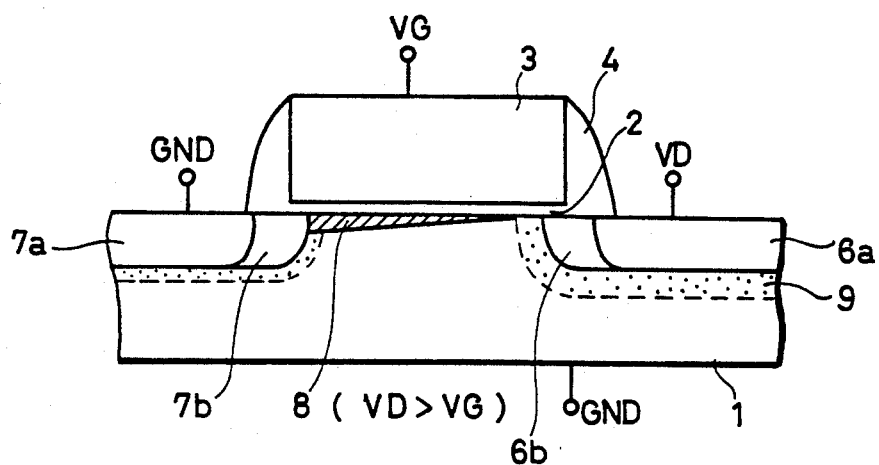
FIGS. 2 and 3 are cross sectional views illustrating the operation of the conventional LDD MOSFET.
Figure 3:
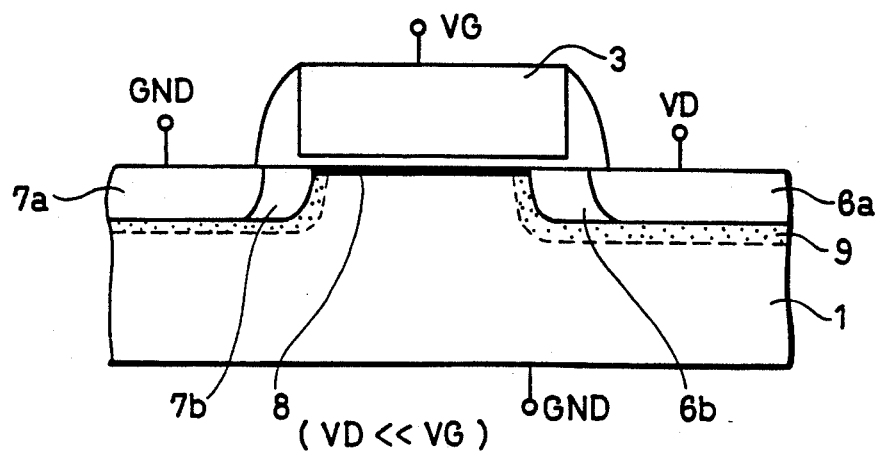
Figure 4A:
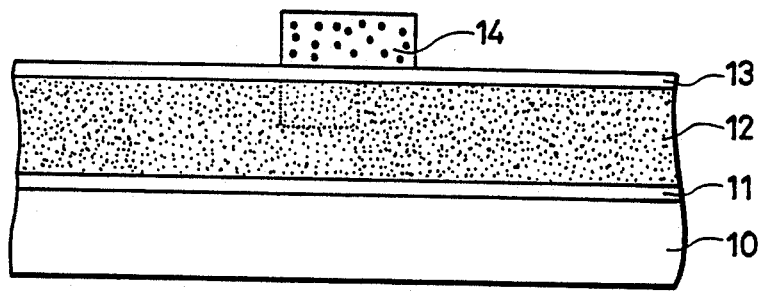
FIGS. 4A to 4F are cross sectional views showing the manufacturing steps of a conventional gate overlapped type LDD MOSFET having a gate electrode of an inverted T shape.
Figure 4B:
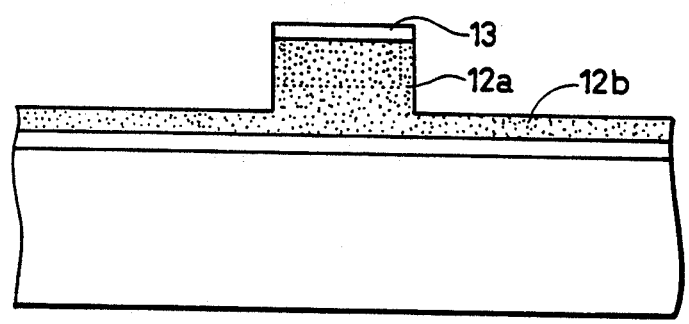
Figure 4C:
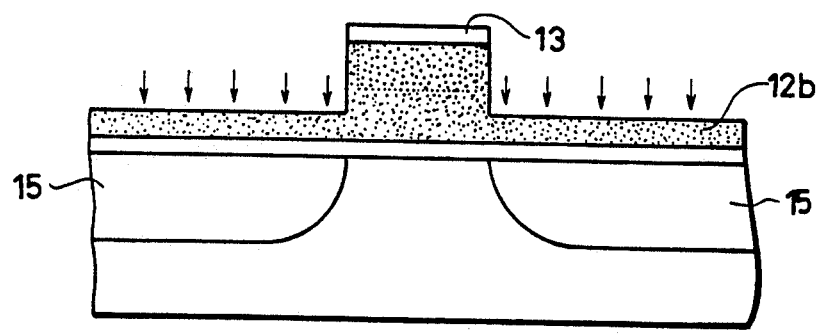
Figure 4D:
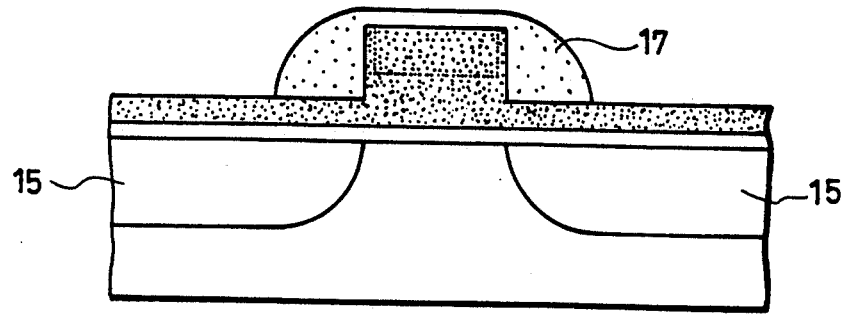
Figure 4E:
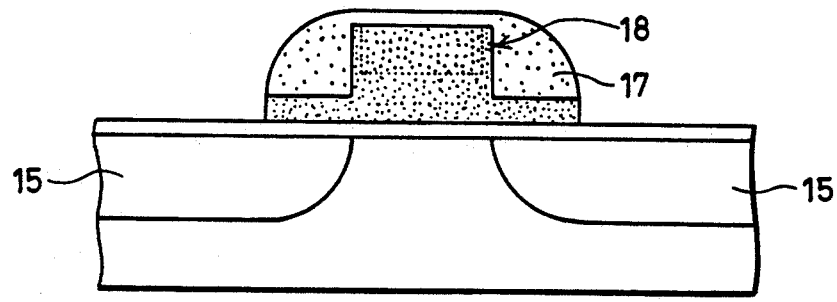
Figure 4F:
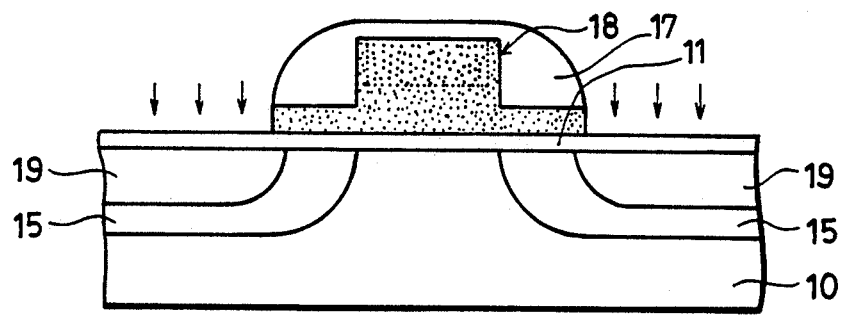
Figure 5:
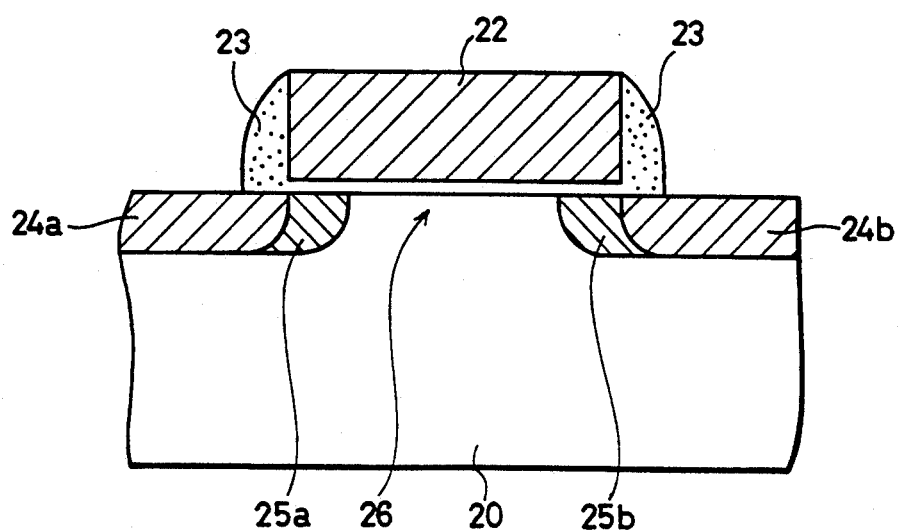
FIG. 5 is a cross sectional view of a MOSFET having the LDD structure in accordance with a first embodiment of the present invention.

Referring to FIG. 5, a first, most preferable embodiment of the present invention will be described. A gate electrode 22 of polysilicon is formed on a surface of a p type silicon substrate with a gate oxide film 21 interposed therebetween. The gate electrode 22 has a rectangular cross section whose width in the direction of the gate length is uniform. Sidewall spacers 23 formed of silicon oxide film are formed on the sidewalls of the gate electrode 22. $n^+$ type impurity regions 24a and 24b constituting the source and drain regions of MOSFET are formed space apart from each other on the surface of the silicon substrate 20. Opposing end surfaces of the $n^+$ type impurity regions 24a and 24b get under the sidewall spacers 23 and they are formed approximately at the same position as the sidewall surfaces of the gate electrode 22. The $n^-$ type impurity regions 25a and 25b having lower concentration are formed directly below the gate electrode 22 continuous to the end surfaces of the $n^+$ type impurity regions 24a and 24b on the side of the channel region.

Figure 6:
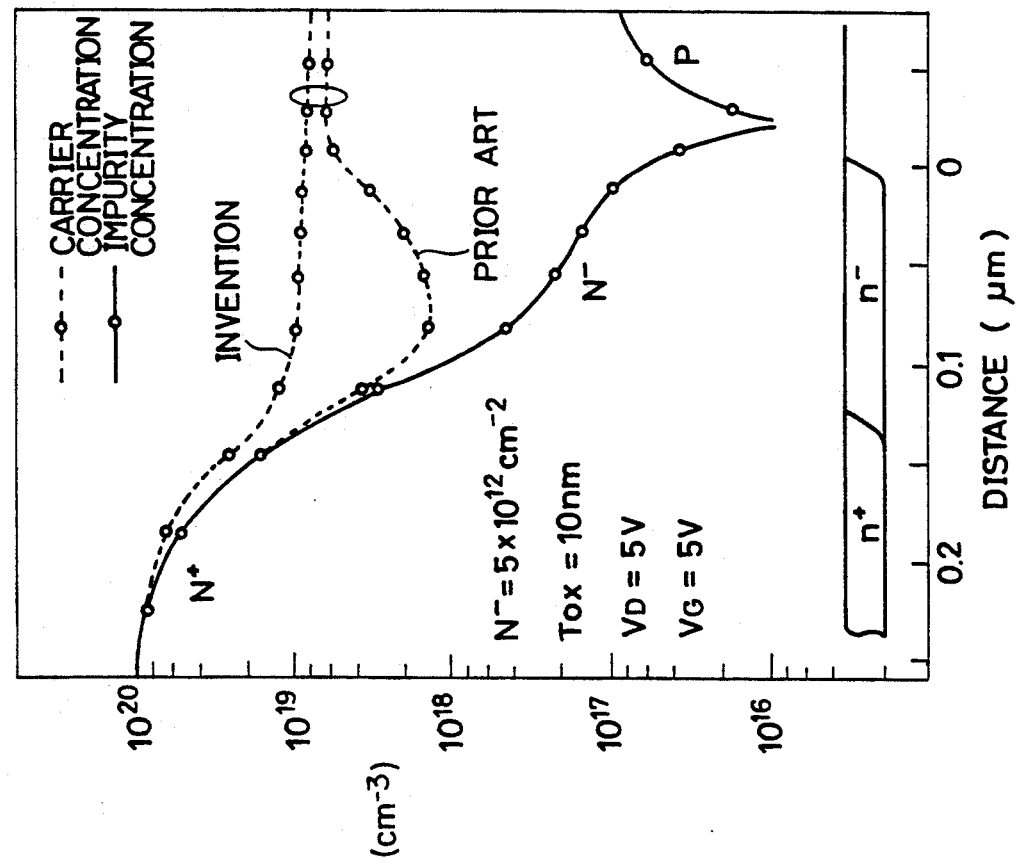
FIG. 6 is a graph showing concentration distribution of impurities carriers near the source side of the MOSFET of the first embodiment.

In the so called gate overlapped LDD structure in which $n^-$ type impurity regions 25a and 25b are formed below the gate electrode, the carrier concentration on the surfaces of the $n^-$ type impurity regions 25a and 25b is increased due to the positive voltage applied to the gate electrode during operation. This is shown in FIG. 6. FIG. 6 shows the carrier concentration on the surface of the silicon substrate near the source region, which is analyzed by a device simulator. The surface impurity concentration of the $n^-$ type impurity region 25a having lower concentration is about $10^{17}/cm^3$.

In a conventional LDD MOSFET not having the gate overlapped structure, the surface of the $n^-$ type impurity region is not influenced by the gate electrode even when a voltage of 5V is applied to the gate electrode, and therefore the carrier concentration on that surface is increased to only about $10^{18}/cm^3$, which is lower than the carrier concentration (about $10^{19}/cm^3$) in the channel region 26 by the order of one digit. The region having lower carrier concentration serves as a resistance, causing the decrease of the on-resistance of the drain current. Meanwhile, in the embodiment of the present invention, the $n^-$ type impurity regions are covered by the gate electrode, so that the carrier concentration of those regions are increased to about $10^{19}/cm^3$ when 5 V is applied to the gate electrode, which concentration is approximately the same as that of the channel region. Consequently, the $n^-$ type impurity regions do not serve as resistances, remarkably improving the on-resistance of the drain current.

Figure 7A:
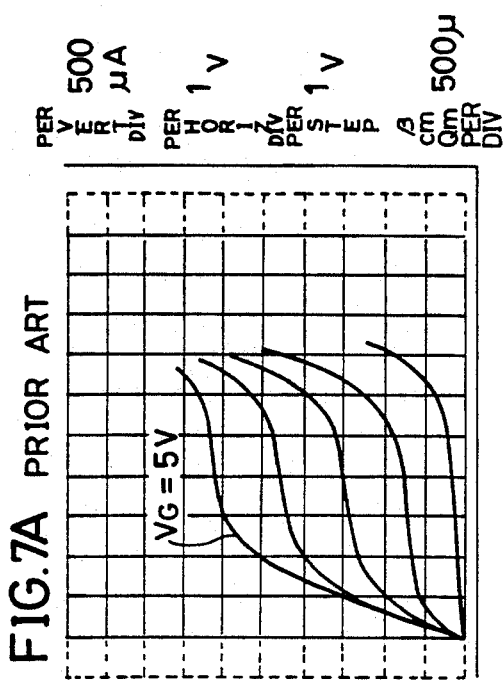
FIG. 7A is a graph showing a drain current characteristics representing the on-resistance of a conventional LDD MOSFET.
Figure 7B:
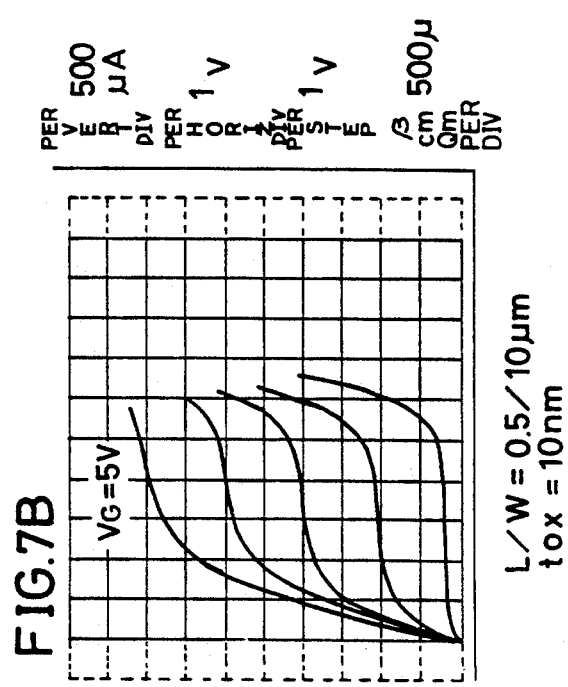
FIG. 7B is a graph showing the drain current characteristics representing the on-resistance of the LDD MOSFET of the first embodiment of the present invention.

FIGS. 7A and 7B are graphs showing the on-resistance of the drain current of a conventional MOSFET not having the gate overlapped structure (FIG. 7A) and of the MOSFET of the present embodiment (FIG. 7B), in which the gate length $L=0.5$ μm, the gate width $w=10$ μm and the gate oxide film thickness $t_{OX}=10$ nm. Referring to these graphs, the drain current $I_D$ is increased to 3.3 mA in the prior art while it is increased to 4 mA in the present embodiment, when the drain voltage $V_D=5V$ and the gate voltage $V_G=5V$.

Figure 8A:
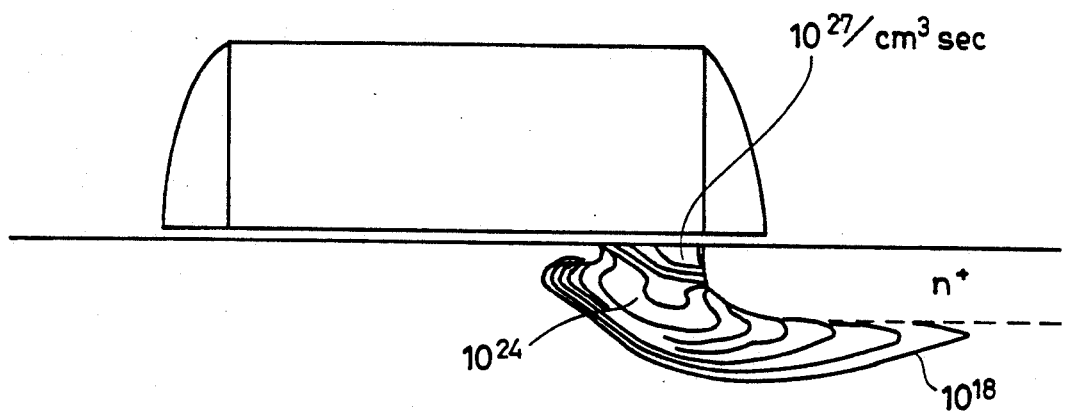
FIG. 8A is a contour distribution showing the rate of carrier generation in the high electric field drain region of the conventional LDD MOSFET.
Figure 8B:
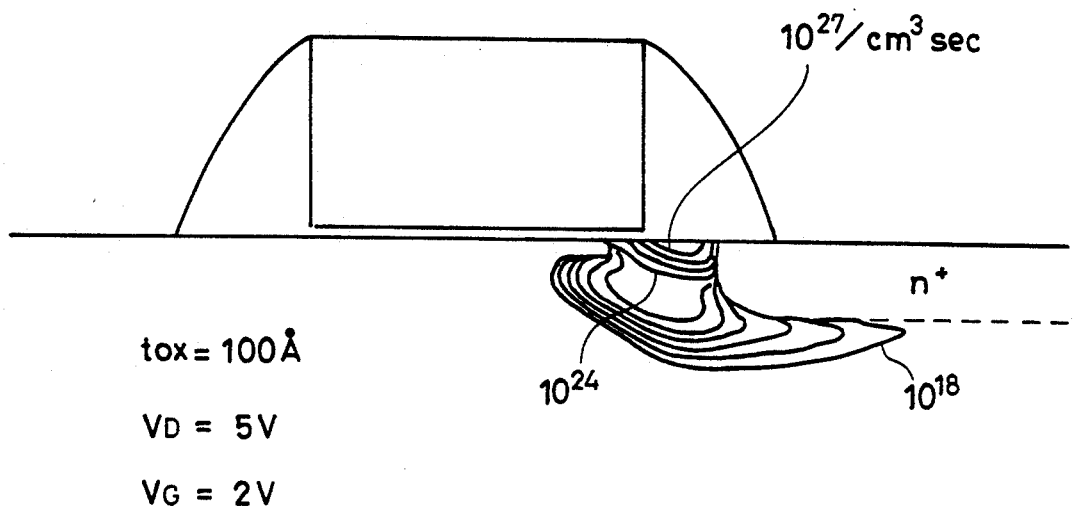
FIG. 8B is a contour distribution showing the rate of carrier generation in the high electric field drain region of the LDD MOSFET of the first embodiment of the present invention.

Meanwhile, carriers are generated by collision ionization due to the high electric field at the end of the drain. FIGS. 8A and 8B show contour distribution of the rate of carrier generation. As shown in FIG. 8B, the region of carrier generation is directly below the sidewall provided at the end of the gate electrode in the prior art, so that the generated carriers are introduced to the sidewall, causing depletion of the n⁻ type impurity region, degrading the on-resistance and damaging the reliability. Meanwhile, in the present invention, the region of carrier generation is moved from directly below the sidewall 23 to directly below the gate, eliminating the above described problems and remarkably improving the reliability.

In addition, the gate electrode 22 of the MOSFET in accordance with the present embodiment has a rectangular cross section. Compared with the conventional MOSFET having the inverted T shape, the effective conductive area is larger when the gate length is the same, whereby the wiring resistance of the gate electrode can be reduced.

The method for manufacturing the MOSFET of the present invention will be described.

Figure 9A:
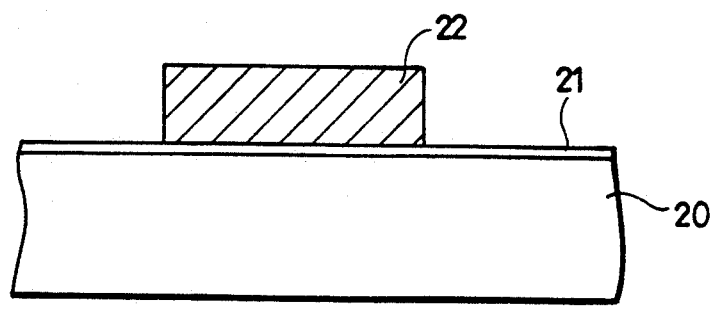
FIGS. 9A to 9F are cross sectional views showing the manufacturing process of the MOSFET of the first embodiment of the present invention.

FIGS. 9A to 9F show the manufacturing steps of the MOSFET in this order. A gate oxide film 21 is formed on a surface of a silicon substrate 20 by thermal oxidation method. A polysilicon layer is deposited on the surface thereof by CVD (Chemical Vapor Deposition) method. A gate electrode 22 having a rectangular cross section is formed by photolithography and etching (FIG. 9A).

Figure 9B:
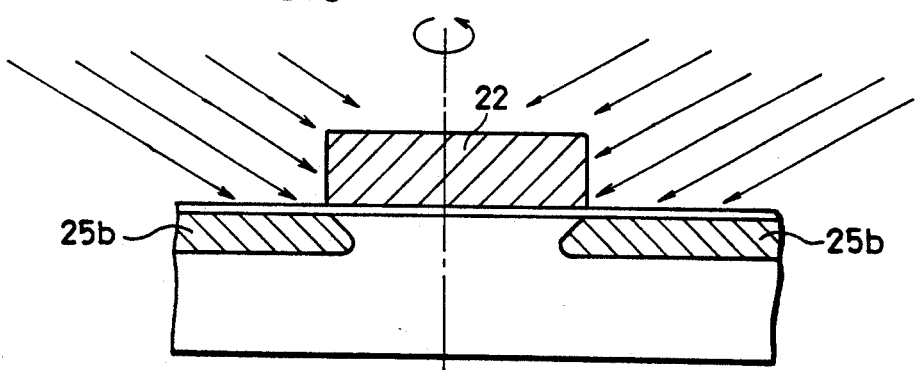
Figure 10:
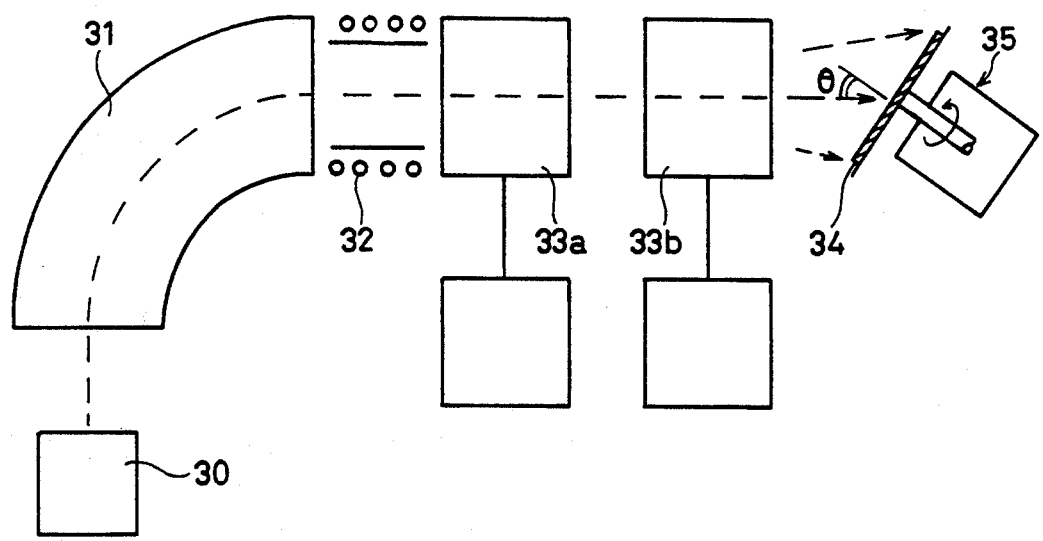
FIG. 10 is a schematic diagram of an ion implanting apparatus employed for manufacturing the MOSFET of the present invention.
Figure 11:
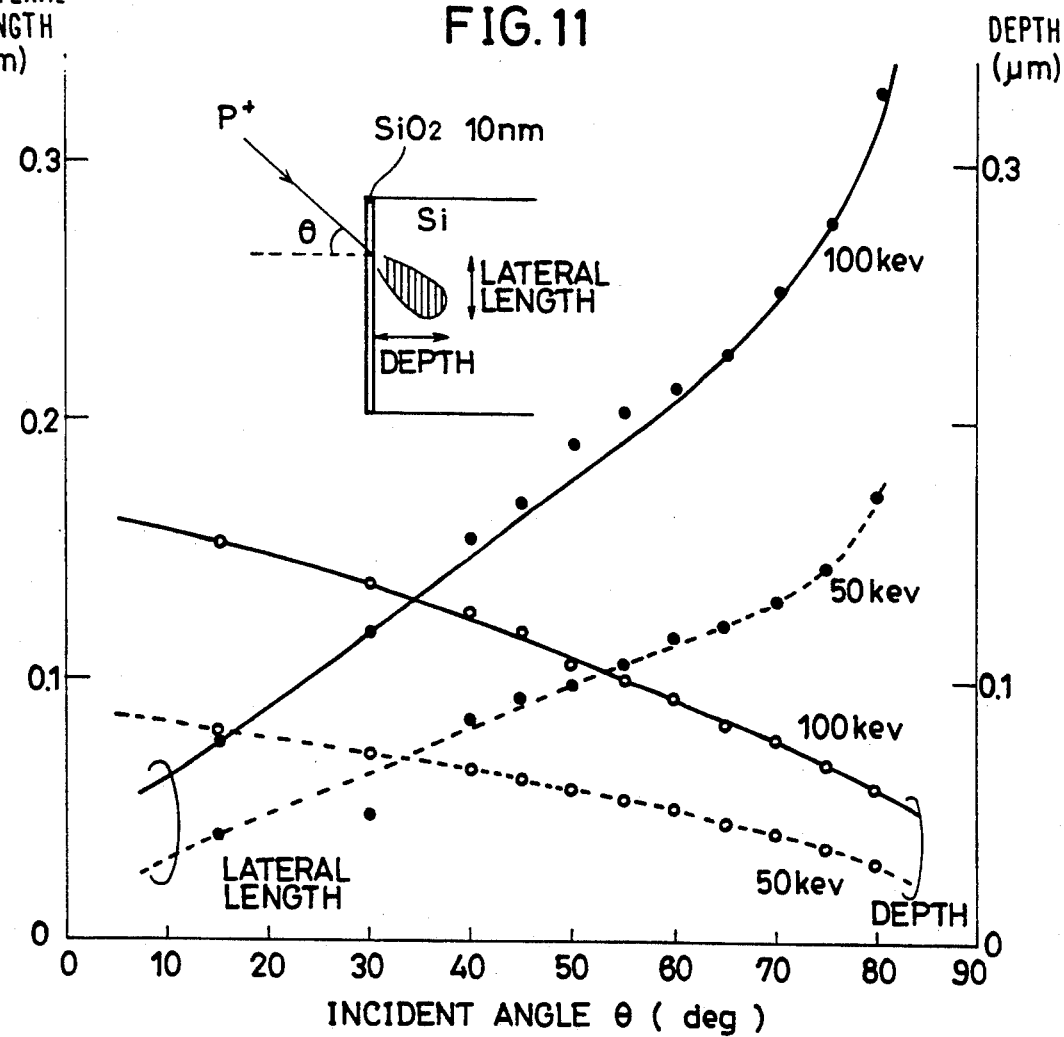
FIG. 11 is a graph showing the relation between an incident angle and distribution of the region of entrance of an ion beam in the oblique ion implantation.

Thereafter, ions of phosphorus (P) are implanted to the surface of the silicon substrate using the gate electrode 22 as a mask to form n⁻ type impurity regions 25a and 25b (FIG. 9B). The first step of ion implantation is carried out in the following manner. FIG. 10 illustrates the ion implanting step using an ion implanting apparatus. Phosphorus ions having prescribed mass are selected by an analyzer magnet 31 out of the phosphorus ions drawn out from an ion source 30. The selected ions are accelerated by an acceleration tube 32 to have prescribed implant energy, and implanted to the surface of a wafer 34 with the deflection controlled by X and Y scan plates 33b and 33a. The wafer 34 is mounted and fixed on a rotary surface of a wafer rotating mechanism 35. The wafer rotating mechanism 35 is capable of inclining the wafer surface to an arbitrary angle θ in association with the incident angle of the ion beam. The wafer rotating mechanism 35 comprises a rotating mechanism for rotating the wafer 34. By using such ion implanting apparatus, the phosphorus ions can be implanted such that the ions get into the region directly below the gate electrode 22. Dimensions of the n⁻ type impurity regions 25a and 25b formed directly below the gate electrode 22 in a direction of the substrate main surface (referred to as a lateral direction) and in a direction vertical to the main surface of the substrate (referred to as a depth direction) can be controlled by adjusting the incident angle of the ion beam and the implant energy. The relation is shown in FIG. 11. When the implant energy of the phosphorus ions is set at 100 kev and the incident angle is set at 50°, for an example, the lateral length of the n⁻ type impurity region overlapping with the gate electrode will be about 0.19 μm.

The impurity concentration of the n⁻ type impurity region is determined by adjusting the amount of doping of the ions to be implanted.

Figure 12:
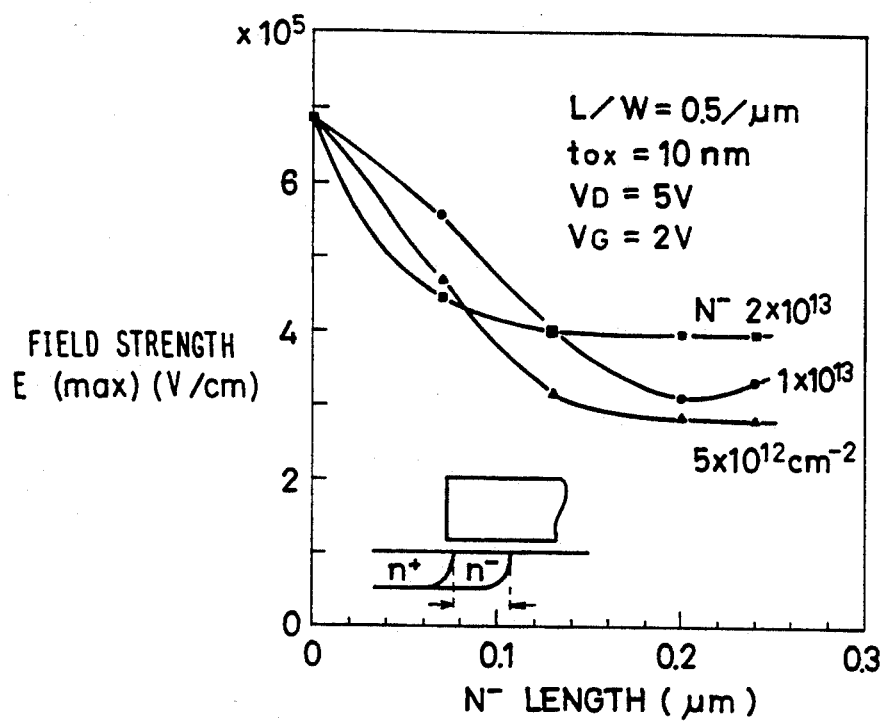
FIG. 12 is a graph showing a relation between a lateral length and field strength of the impurity region having lower concentration of the LDD structure of the MOSFET in accordance with the present invention.
Figure 13:
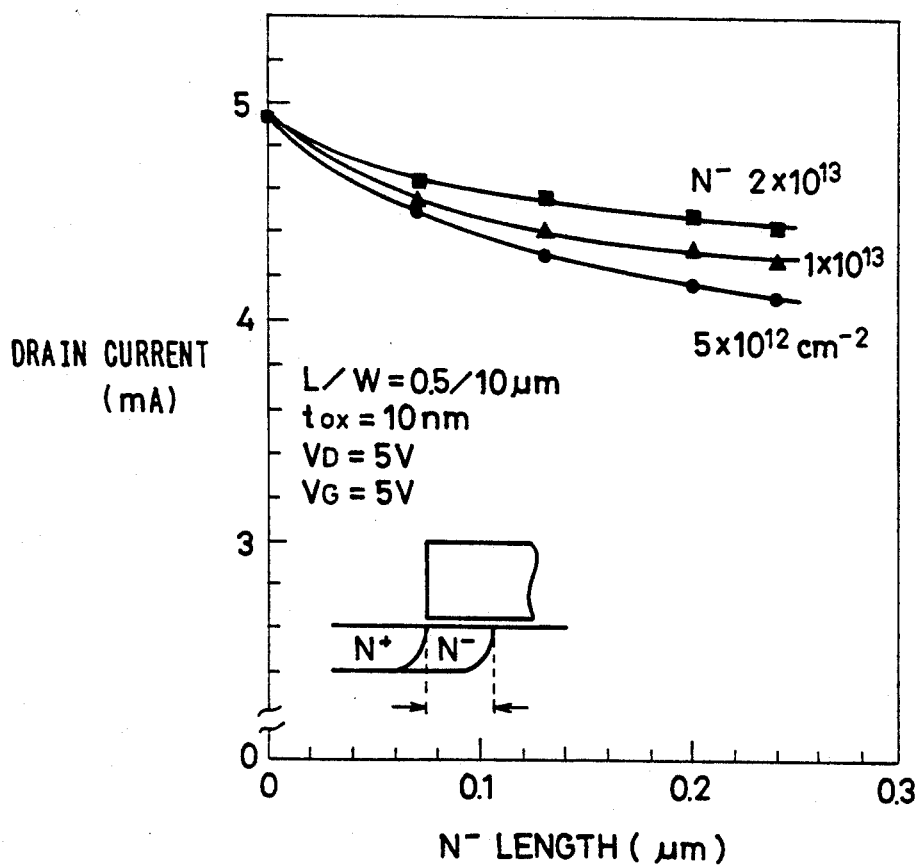
FIG. 13 is a graph showing a relation between the lateral length and the drain current of the impurity region having lower concentration.

As described above, the lateral length and the impurity concentration of the n⁻ type impurity region covered by the gate electrode 22 can be precisely controlled by adjusting the incident angle of the ion beam, the implant energy and concentration. Therefore, the actual settings of the lateral length and the impurity concentration of the n⁻ type impurity region are determined dependent on the relation between the increase/decrease of the drain current showing the on-resistance of the MOSFET and the increase/decrease of the field strength near the n⁻ type impurity region in association with the reliability. FIG. 12 shows a relation between the field strength and various settings of the n⁻ type impurity region. FIG. 13 similarly shows a relation between the drain current and various settings of the n⁻ type impurity region.

Figure 9C:
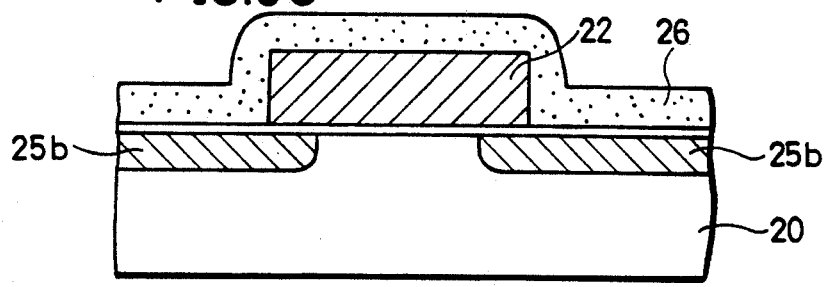

A silicon oxide film 26 is deposited on the surface of the silicon substrate 20 by the CVD method (FIG. 9C).

Figure 9D:
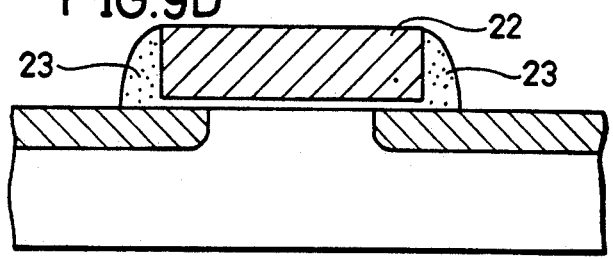

Thereafter, the silicon oxide film 26 is etched by anisotropic etching method to form sidewall spacers 23 only on the sidewalls of the gate electrode 22 (FIG. 9D)

Figure 9E:
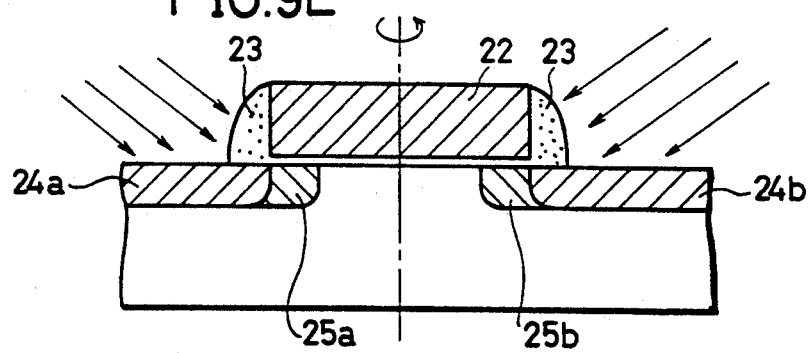
Figure 9F:
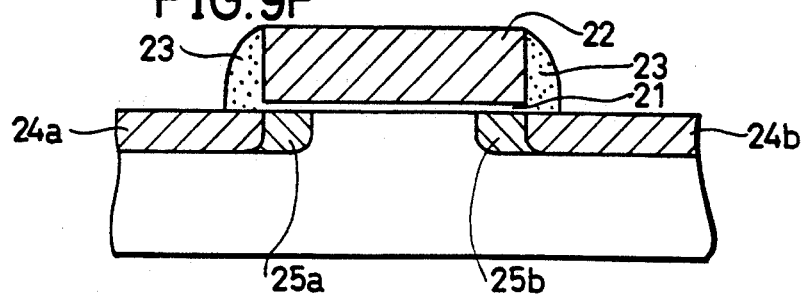

Ions of arsenic (As) are implanted to the surface of the silicon substrate using the sidewall spacers 23 and the gate electrode 22 as a mask to form n⁺ type impurity regions 24a and 24b having higher concentration. The second ion implantation is carried out by implanting ions of arsenic obliquely from above, with the wafer being rotated as in the first step of ion implantation. By adjusting the incident angle and energy of the ion beam, the structure can be formed in which the arsenic ions get into the lateral direction by the length corresponding to the width of the sidewall spacers 23 (FIG. 9E).

Thereafter, thermal processing is carried out for an appropriate time and at an appropriate temperature preventing thermal diffusion of the implanted impurities, so as to activate the implanted impurities. The MOSFET having LDD structure with the dimension of the impurity regions having lower concentration being precisely adjusted can be manufactured through the above described steps.

Although an n channel type MOSFET has been described in the foregoing, the present invention maybe applied to a p channel MOSFET by changing the conductivity type to provide the same effect, and the same manufacturing method can be utilized for a CMOS type semiconductor device having both n channel and p channel types.

Figure 14:
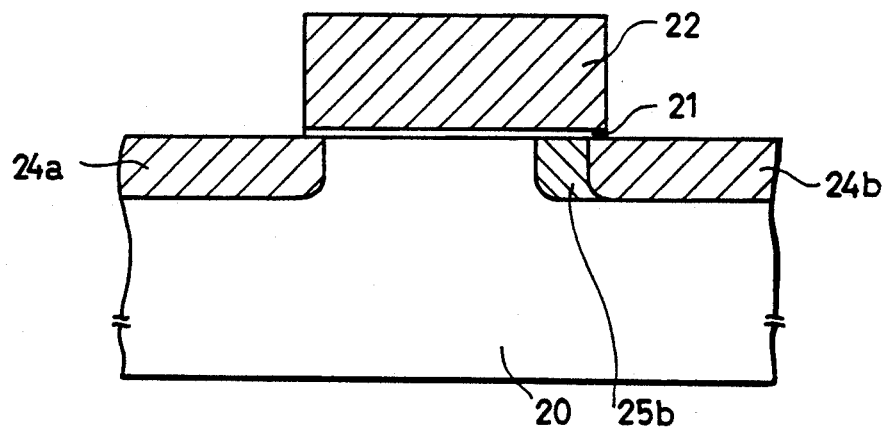
FIG. 14 is a cross sectional view of a MOSFET having the LDD structure in accordance with a second embodiment of the present invention.

A second embodiment of the present invention will be described in the following. Compared with the first embodiment, the second embodiment provides a MOSFET having a LDD structure on one side in which the impurity region having lower concentration directly below the gate electrode is formed only on the drain side, as shown in FIG. 14. A gate oxide film 21 and a gate electrode 22 are formed on a p type silicon substrate 20. n⁺ type source and drain regions 24a and 24b are formed on the surface of the substrate. The end surfaces on the channel side of the source region 24a and the drain region 24b are approximately aligned with the position of the sidewall surfaces of the gate electrode 22 or inner than the sidewall surfaces of the gate electrode 22 by about 0.1 μm. A n⁻ type impurity region 25b having lower concentration is formed continuous to the end surface of the drain region 24b.

Generally, the increase of the field strength causing the short channel effect is generated on the side of the drain region. Therefore, the LDD structure is effective to prevent this effect when it is formed on the side of the drain region. Therefore, the present embodiment can be effectively applied when one of the impurity regions of the MOSFET is determined to be connected to the source and the other one is determined to be connected to the drain.

The manufacturing method of the MOSFET of this example will be described with reference to FIGS. 15A to 15E.

Figure 15A:
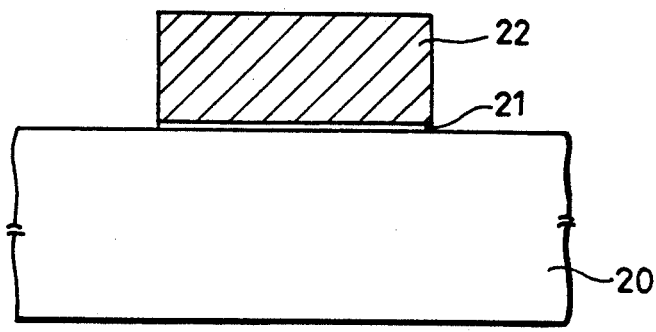
FIGS. 15A to 15E are cross sectional views showing the manufacturing steps of the LDD MOSFET of the second embodiment.

Channel implantation for controlling the element isolating region and the threshold voltage is carried out on a p type silicon substrate 20 (not shown). Thereafter, a gate oxide film 21 and a gate electrode 22 are formed (FIG. 15A).

Figure 15B:
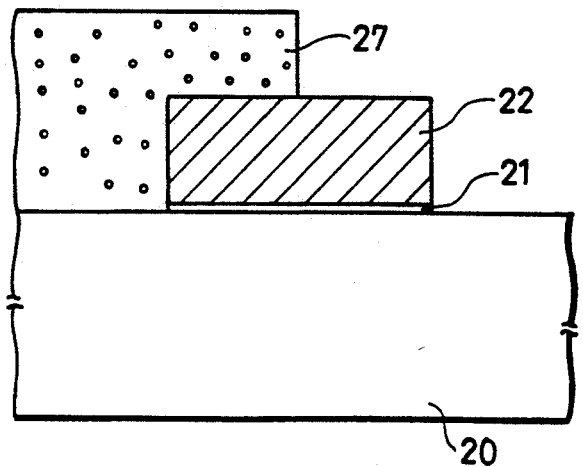

Thereafter, a resist 27 is applied and a pattern is formed such that an end portion of the resist do not cover one end of the gate electrode 22 (FIG. 15B).

Figure 15C:
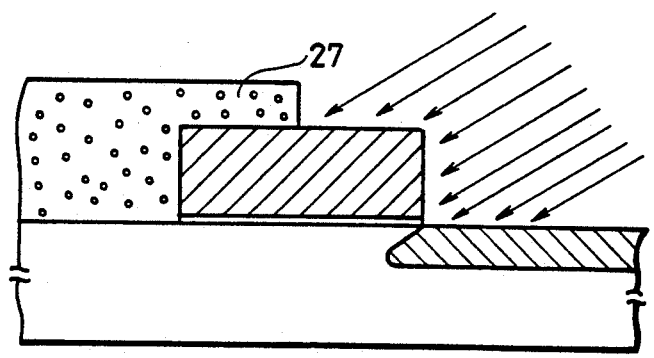

Thereafter, n type impurities such as phosphorus (P) having the concentration of $1 \times 10^{12}/cm^2$ to $1 \times 10^{14}/cm^2$ are obliquely ion implanted to the substrate with the substrate being rotated, using the resist 27 and the gate electrode 22 as a mask to form an n⁻ type impurity region 25b (FIG. 15C).

Figure 15D:
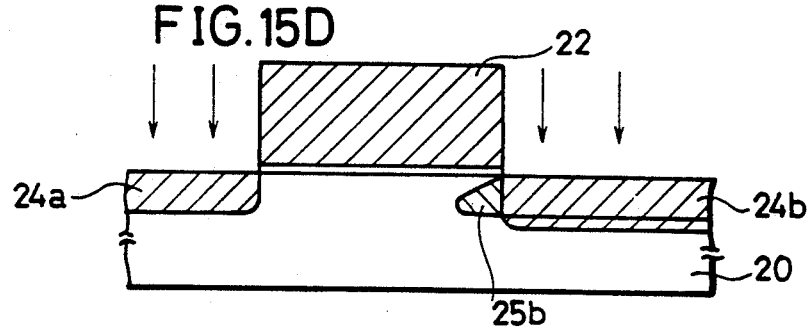
Figure 15E:
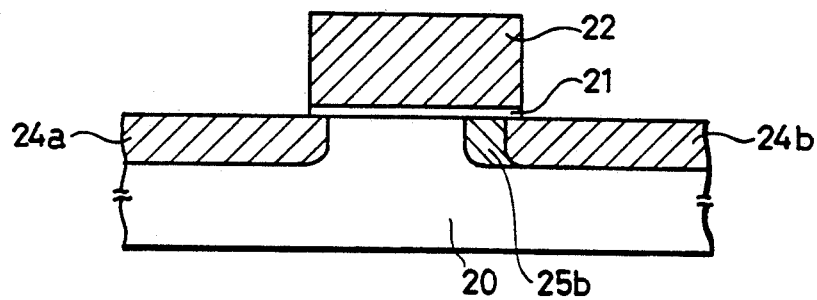

Thereafter, the resist 27 is removed and n type impurities such as arsenic are implanted to $15^{15}/cm^2$ from a direction vertical to the substrate 20 to form n⁺ source 24a and drain 24b impurity regions (FIG. 15D).

Thereafter, thermal processing is carried out to activate the implanted impurities.

The MOSFET having the LDD structure only on the side of the drain is manufactured through the above described steps. The above mentioned oblique ion implantation method is carried out in the similar manner as described in the first embodiment. In the present manufacturing method, regions which do not require ion implantation are covered by a resist during the ion implantation for forming the n⁻ type impurity regions. The implantations of impurities to unnecessary regions can be prevented and the damage to the surface of the substrate is also prevented.

Figure 16:
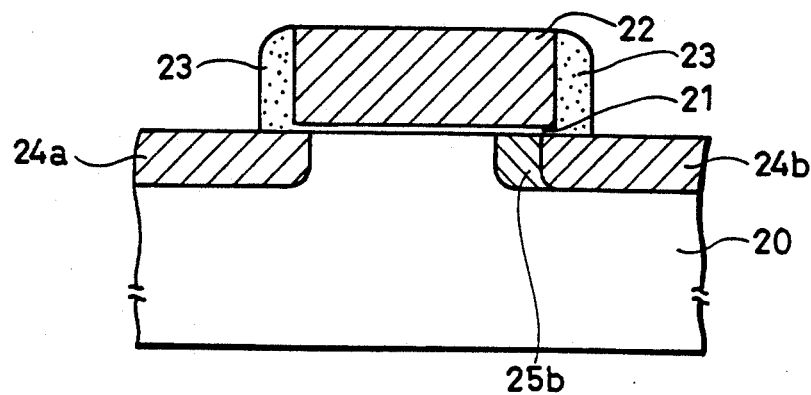
FIG. 16 is a cross sectional view of a MOSFET having the LDD structure in accordance with a third embodiment of the present invention.

A third embodiment will be described. The third embodiment is a modification of the second embodiment, as shown in FIG. 16. The characteristic of this embodiment is that the sidewall spacers 23 of silicon oxide film are formed on both side surfaces of the gate electrode 22. By means of the sidewall spacers, the end surface of the n⁺ type impurity region 24b on the drain side is aligned with the position of the side surface of the gate electrode 22 on the drain side. Consequently, the parasitic capacitance between the gate and drain can be reduced.

Figure 17A:
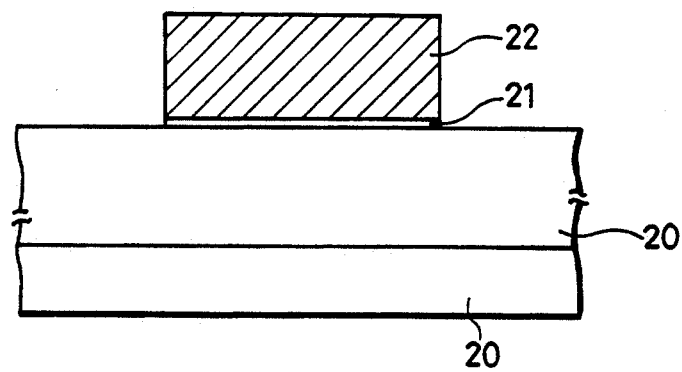
FIGS. 17A to 17F are cross sectional views showing the manufacturing steps of the LDD MOSFET of the third embodiment.
Figure 17B:
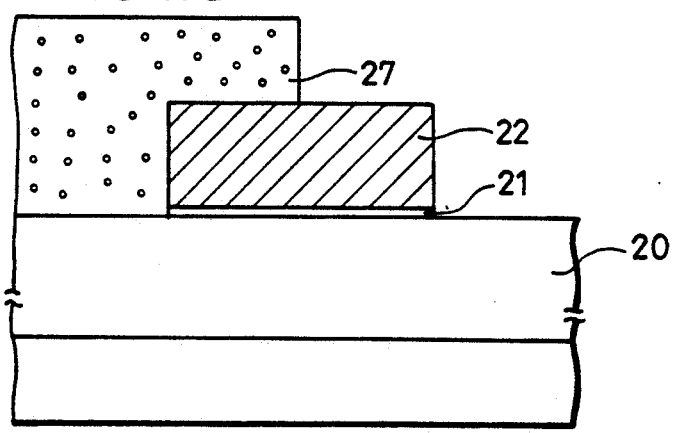
Figure 17C:
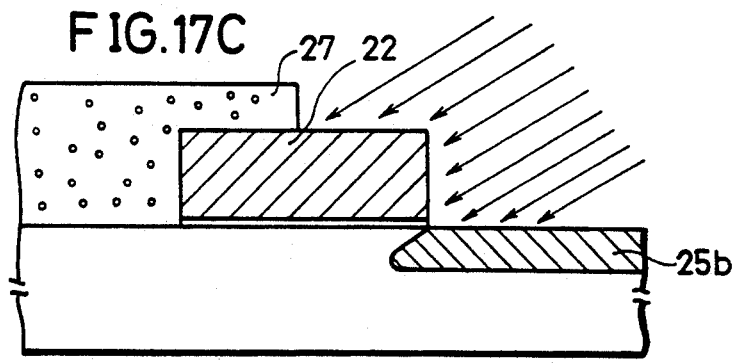
Figure 17D:
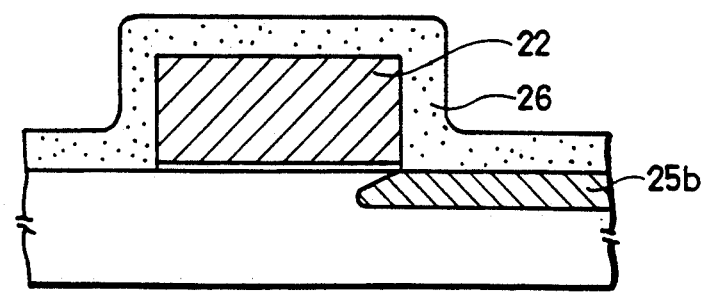
Figure 17E:
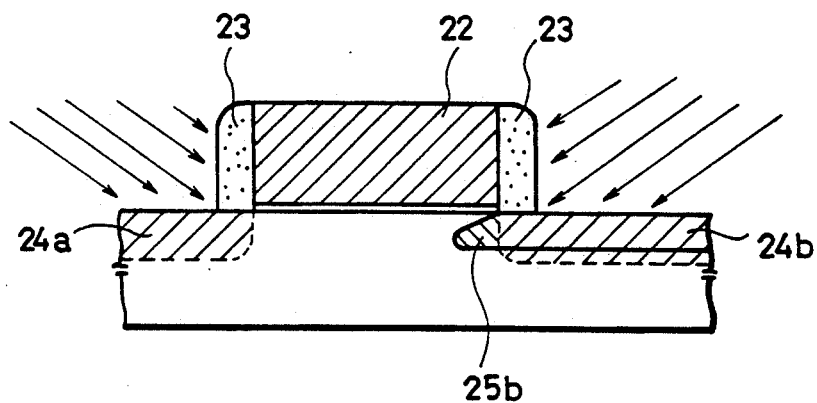
Figure 17F:
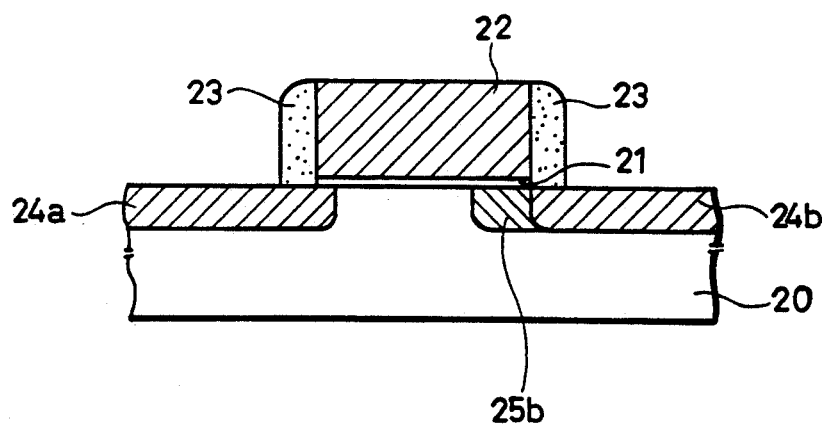

FIGS. 17A to 17F show the manufacturing steps of the MOSFET of the present embodiment in this order. In the manufacturing process, the step of forming the sidewall spacers 23 are inserted after the formation of the n⁻ type impurity region 25b, which is the characteristic of the present embodiment compared with the second embodiment. The step of forming the sidewall spacers 23 comprises the step of depositing a silicon oxide film 26 by the CVD method (FIG. 17D) and the step of forming the sidewall spacers 23 on the side surfaces of the gate electrode 22 by anisotropically etching the silicon oxide film 26. The present embodiment further comprises the step of obliquely implanting ions to the main surface of the substrate with the wafer being rotated, using the gate electrode 22 and the sidewall spacers 23 as a mask (FIG. 17E).

As described above, in the gate overlapped type MOSFET of the present invention, the impurity regions having lower concentration are formed below the gate electrode using oblique ion implantation, thereby saving the trouble of forming special masks for ion implantation, simplifying the manufacturing steps. The distribution of the ion implanted regions can be precisely controlled by virtue of the oblique ion implantation, by adjusting the incident angle of the ion beam, the implant energy and concentration. Therefor, the manufacturing of a structure capable of optimally realizing electric field releasing function of the LDD structure can be easily provided.

The gate overlapped type LDD MOSFET manufactured in this manner has a gate electrode having a rectangular cross section and a low resistance, prevents decrease of the drain current caused by the high resistance of the impurity region having lower concentration, and further prevents the increase of resistance caused by the hot carriers. The gate overlapped type MOSFET having superior on-resistance and high reliability is thus realized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a MOS type field effect transistor having a LDD structure comprising the steps of:

forming an insulating film on a main surface of a semiconductor substrate;

forming a gate electrode on said insulating film by patterning;

forming a resist directly on one end of said gate electrode and a surface of said semiconductor substrate adjacent said one end while leaving the other end of said gate electrode, opposing said one end, and the surface of said semiconductor substrate, adjacent said other end, exposed;

obliquely ion implanting impurities to the main surface of said semiconductor substrate with incident angles of ion beam inclination of 20° to 80° with respect to a normal direction of the main surface of said semiconductor substrate and using said resist and said gate electrode as a mask to form an impurity region having a relatively low concentration at least in a portion of said semiconductor substrate which is beneath said gate electrode at the exposed end;

removing said resist to expose said main surface of said semiconductor substrate and said gate electrode and ion implanting impurities approximately vertically to the exposed main surface of said semiconductor substrate using said gate electrode as a mask to form an impurity region having a relatively high concentration; and activating the impurities implanted in said semiconductor substrate by thermal processing.

2. A method of manufacturing a MOS type field effect transistor according to claim 1, wherein either phosphorus or arsenic is ion implanted with the amount of $1 \times 10^{12}/cm^2$ to $1 \times 10^{14}/cm^2$ in said step of oblique ion implantation.

3. A method for manufacturing a MOS type field effect transistor having a LDD structure according to claim 1, wherein said impurity region having the relatively low concentration is formed in a portion of said main surface of said semiconductor substrate laterally overlapped by said gate electrode.

4. A method for manufacturing a MOS type field effect transistor having a LDD structure, comprising the steps of:

forming an insulating film on a main surface of a semiconductor substrate;

forming a gate electrode on said insulating film by patterning;

obliquely ion implanting impurities to the main surface of said semiconductor substrate with incident angles of ion beam inclination of 20° to 80° with respect to a normal direction of the main surface of said semiconductor substrate and using said gate oxide as a mask to form an impurity region having a relatively low concentration in at least said semiconductor substrate covered by said gate electrode;

forming a sidewall spacer of an insulating film on a side surface of said gate electrode;

obliquely ion implanting impurities to the main surface of said semiconductor substrate with incident angles of ion beam inclination of 20° to 80° with respect to a normal direction of the main surface of said semiconductor substrate and using said gate electrode with said sidewall spacer formed thereon as a mask, to form an impurity region having a relatively higher concentration with a portion thereof extending in a region below said sidewall spacer; and activating the impurities implanted in said semiconductor substrate by thermal processing.

5. A method for manufacturing a MOS type field effect transistor according to claim 4, wherein said step of ion implantation is carried out with said semiconductor substrate rotated about an axis orthogonally crossing the main surface of said semiconductor substrate.

6. A method for manufacturing a MOS type field effect transistor having a LDD structure according to claim 4, wherein said portion of said impurity region having the relatively high concentration is formed in the main surface of said semiconductor substrate immediately below, and in contact with, said sidewall spacer.

7. A method for manufacturing a MOS type field effect transistor having a LDD structure according to claim 4, wherein said impurity region having the relatively low concentration is formed in a portion of said main surface of said semiconductor substrate laterally overlapped by said gate electrode.

8. A method for manufacturing a MOS type field effect transistor having a LDD structure, comprising the steps of:

forming an insulating film on a main surface of a semiconductor substrate;

forming a gate electrode on said insulating film by patterning;

covering a surface region of one side of the surface of said semiconductor substrate divided by said electrode with a resist;

obliquely ion implanting impurities to the main surface of said semiconductor substrate using said resist and said gate electrode as a mask to form an impurity region of a relatively low concentration at least in said semiconductor substrate covered by said gate electrode;

forming a sidewall spacer of an insulating film on a side surface of said gate electrode;

obliquely ion implanting impurities to the main surface of said semiconductor substrate using said gate electrode with said sidewall spacer formed thereon as a mask to form an impurity region of relatively high concentration with a portion thereof extending in a region below said sidewall spacer; and activating the impurities implanted in said semiconductor substrate by thermal processing.

9. A method for manufacturing a MOS type field effect transistor according to claim 8, wherein impurity ions of either phosphorus or arsenic are implanted with the amount of $1 \times 10^{12}/cm^2$ to $1 \times 10^{14}/cm^2$ in said step of implanting ions to form said impurity region of lower concentration.

* * * * *